United States Patent
Fushimi et al.

[11] Patent Number: 5,151,334
[45] Date of Patent: Sep. 29, 1992

[54] FUEL CELL UTILIZING SOLIDOUS ELECTROLYTE

[75] Inventors: Kazuo Fushimi, Saitama; Kaoru Kitakizaki, Kanagawa; Kazuhiko Kawakami, Tokyo, all of Japan

[73] Assignee: Kabushiki Kaisha Meidensha, Tokyo, Japan

[21] Appl. No.: 573,245

[22] Filed: Aug. 24, 1990

[30] Foreign Application Priority Data

Aug. 24, 1989 [JP] Japan .................................. 1-217777
Aug. 24, 1989 [JP] Japan .................................. 1-217780

[51] Int. Cl.$^5$ .................... H01M 8/10; H01M 4/86
[52] U.S. Cl. .................................. 429/32; 429/33; 429/30; 429/44; 429/45; 429/40
[58] Field of Search ............... 429/30, 32, 33, 44, 429/45, 40

[56] References Cited

U.S. PATENT DOCUMENTS

| | | | |
|---|---|---|---|
| 3,464,861 | 9/1969 | Williams et al. | 429/30 |
| 3,525,646 | 8/1970 | Tannenberger et al. | 429/31 |
| 3,551,209 | 12/1970 | Alles et al. | 429/32 |
| 3,960,598 | 6/1976 | Kohlmuller | 429/39 |
| 4,129,685 | 12/1978 | Damiano | 429/44 |
| 4,948,680 | 8/1990 | Madou et al. | 429/33 |

FOREIGN PATENT DOCUMENTS

| | | |
|---|---|---|
| 2182650 | 12/1973 | France . |
| 62-268063 | 11/1987 | Japan . |
| 63-53863 | 3/1988 | Japan . |
| 1-10576 | 1/1989 | Japan . |
| 515622 | 11/1971 | Switzerland . |
| 8804108 | 6/1988 | World Int. Prop. O. . |
| 8911739 | 11/1989 | World Int. Prop. O. . |

OTHER PUBLICATIONS

Fuel Cell Handbook, By A. J. Appleby and F. R. Foulkes, pp. 304–307, 432437, 440–445 and 588–593, published by Van Nostrand Reinhold, 1989.

Primary Examiner—Anthony McFarlane
Assistant Examiner—Nhat Phan
Attorney, Agent, or Firm—Bachman & LaPointe

[57] ABSTRACT

A cell unit structure for stacking to form a fuel cell is described, composed of a porous substrate, a hydrogen electrode film formed of fine particles of nickel powder stacked on the porous substrate to form fine voids of homogeneous diameter, a film of solidous electrolyte stacked on the hydrogen electrode film, and an oxygen electrode film stacked on the electrolyte film.

13 Claims, 4 Drawing Sheets

FUEL CELL UTILIZING SOLIDOUS ELECTROLYTE

BACKGROUND OF THE INVENTION

1. Field of the Invention

The present invention relates generally to a fuel cell utilizing solidous electrolyte. Specifically, the present invention relates to a fuel cell which is composed of stacking solidous electrolyte thin film and a process for forming same.

2. Description of the Background Art

Fuel cells, such as plate type fuel cells are well known cell products utilizing porous substrates.

Generally, fuel cells for the production of electrical energy from a fuel and oxidant are well known in the art. Simply put, such cells are composed of a plurality of cell unit structures comprising sequentially stacked porous substrate, an anode electrode film, an electrolyte layer and a cathode electrode film, the cell units are connected in series. Hydrogen gas as fuel is provided in the cathode side of the fuel cell body and air (Oxygen gas) as oxidant is provided in the anode side thereof, then hydrogen and oxygen are reacted for producing electromotive force and water as a by-product. The electrolyte can be a solid, a molten paste, a free-flowing liquid, or a liquid trapped in a matrix. This invention is concerned with the solid type of electrolyte which is preferred for many applications.

It is also well known in the art that voltage dropping in a solidous electrolyte may be indicated by following formula:

$$V = iRT \times 10^{-4}$$

wherein
V: voltage dropping
i: electric current (A)
R: resistance (ohm·cm)
t: thickness of solidous electrolyte ($\mu$m).

From the above relationship, voltage dropping of fuel cell can be reduced corresponding to reducing the thickness of the solidous electrolyte. On the other hand, as a solidous electrolyte is formed on a thin electrode film over the porous substrate, the thickness of the electrolyte is determined by its coverage ability but must be thick enough to support a stacked cell structure, therefore, thinner is better but the minimum thickness is restricted. In view of these points, it has been assumed that thickness in a range of 10 to 50 $\mu$m is preferrable for a solidous electrolyte layer.

Porous substrates generally in use have dispersed void sizes in a range of 0.5 to 40 $\mu$m. Numbers of pin holes are formed in both the electrode film and the solidous electrolyte where it is stacked on portions of the substrate having relatively large void sizes, when the thin electrode film with the solidous electrolyte are stacked on the substrate.

As well known in the art, electromotive force is produced at both sides of the solidous electrolyte when a concentration difference is created by a partial pressure difference of oxygen at each side. That is, the partial pressure difference forms a kind of concentration cell. The electromotive force of a fuel cell may be derived by the following formula:

$$E_O = (RT/4F) \times ln(P_1/P_2)$$

wherein
R: gas constant
T: absolute temperature
F: Faraday constant
$P_1, P_2$: partial pressure of oxygen at both sides of the solidous electrolyte.

As shown in the above formula, electromotive force $E_O$ proportionally increases corresponding to the ratio of the oxygen partial pressure. Therefore, any pin holes formed in the solidous electrolyte reduces the partial pressure difference of oxygen to zero, it causes loss of electromotive force or may even make the production thereof impossible. Avoid the formation of pin holes is greatly important for forming fuel cells.

SUMMARY OF THE INVENTION

It is therefore the principal object of the present invention to provide a fuel cell utilizing solidous electrolyte inducing a minimum of voltage drop.

It is another object of the present invention to provide a fuel cell utilizing a thin solidous electrolyte in which the electrode surface to which the electrolyte is applied has fine voids of homogeneous diameter.

It is a further object of the present invention to provide a fuel cell utilizing solidous electrolyte which is free from pin holes.

It is a furthermore object of the present invention to provide a method for forming a fuel cell utilizing thin film of solidous electrolyte.

A fuel cell constructed of a plurality of cell unit structures stacked and connected in series, wherein the cell unit structure is composed of, a porous substrate, a hydrogen electrode film stacked on the porous substrate, the hydrogen electrode formed of fine particles of nickel powder having fine voids of homogeneous diameter, a solidous electrolyte film stacked on the hydrogen electrode film, and an oxygen electrode film stacked on the solidous electrolyte film.

A process for forming the above-mentioned fuel cell, wherein the cell unit structure is formed by a process comprising the steps of: preparing a porous substrate for a base of the cell unit structure, stacking a hydrogen electrode thin film having fine voids of homogeneous diameter on the porous substrate, wherein the film is formed by pressing a mixture of fine particles of nickel powder then sintering the mixture, stacking a solidous electrolyte film on the hydrogen electrode film, and stacking an oxygen electrode film on the solidous electrolyte film.

BRIEF DESCRIPTION OF THE DRAWINGS

The present invention will be understood from the detailed description given hereinbelow and from the accompanying drawings of the preferred embodiments which are given for explanation and understanding only and are not intended to imply limitation to the invention.

In the drawings.

DETAILED DESCRIPTION OF THE PREFERRED EMBODIMENT

The present invention will now be described in detail referring to the accompanying drawings.

Figure 1:
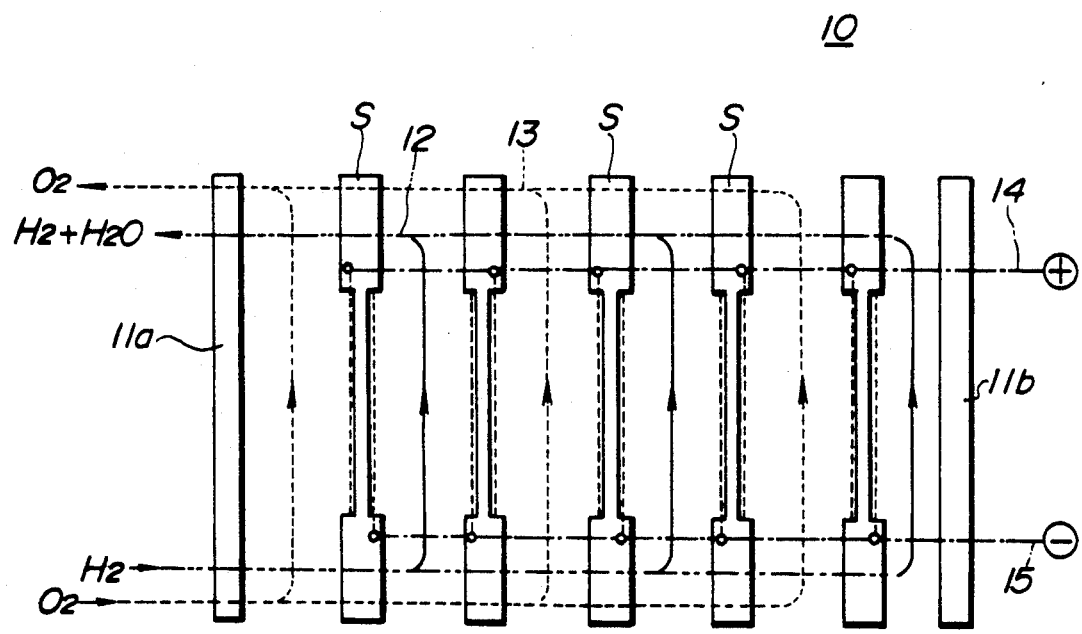
FIG. 1 is a plan view of a conventional stacked cell.

Referring now to FIG. 1, a fuel cell body 10 is composed of a plurality of cell unit structures S, a pair of fixing plates 11a and 11b to connect the stacked cell units S in series, a hydrogen path 12 for providing hydrogen to a cathode plate side of each cell unit S, an oxygen path 13 for providing oxygen to an anode plate side of each cell unit S, and a pair of lead lines 14 and 15 to collect electric power from the cathode and the anode sides of each cell unit S. Both paths 12 and 13 which provide gas are installed on the outside of the cell body 10, and lead lines 14 and 15 are installed on the outside of each cell unit S.

Electric power and water (as a by-product) are produced when hydrogen gas and air (oxygen gas), provided respectively, react through an electrolyte, then electric power produced is collected by the lead lines 14 and 15.

Figure 2:
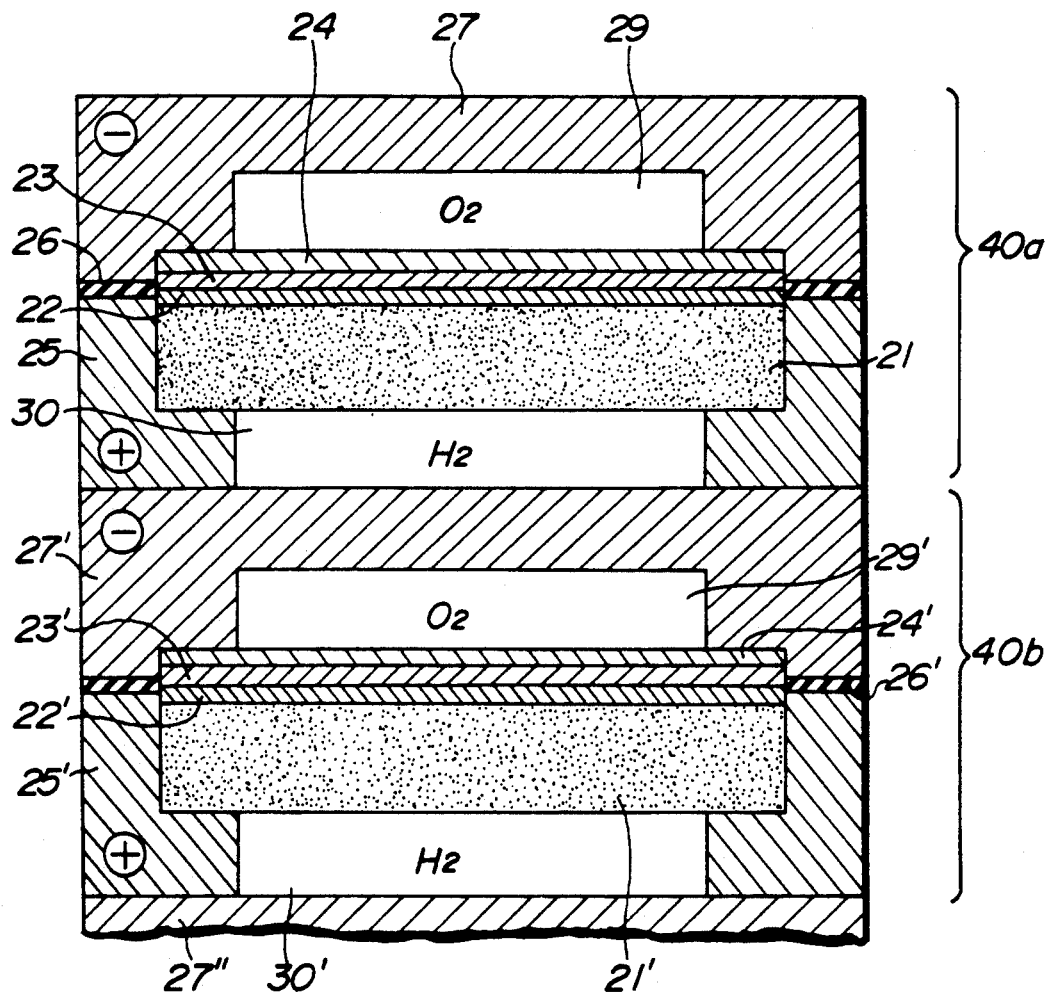
FIG. 2 is a partial longitudinal sectional view of stacked unit structures of a conventionally used fuel cell.

FIG. 2 is an enlarged longitudinal sectional view of stacked fuel cell bodies as shown in FIG. 1 which utilize a type of solidous electrolyte. A cell unit is composed of a lamination of a porous substrate 21 formed of stainless steel, a hydrogen electrode film (a first electrode film) 22, a solidous electrolyte film 23, and an oxygen electrode film (a second electrode film) 24, which are laminated sequentially.

The hydrogen electrode film 22 is formed on the porous substrate 21 as in the following example;

EXAMPLE 1

As the porous substrate for the base of the hydrogen electrode, SUS316L (JIS standard) having about 40% of void ratio, 0.5 µm of nominated void size and about 1 mm of thickness was used. Although the nominated void size is indicated as 0.5 µm, the actual void sizes are dispersed in a certain range, there are many voids having about 10 µm, sometimes up to about 40 µm.

Figure 3:
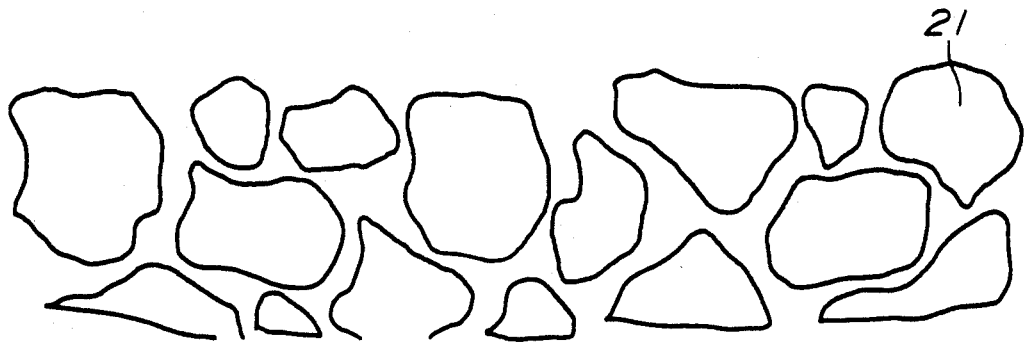
FIGS. 3 to 7 are enlarged cross sectional views showing a process of forming a thin film for a hydrogen electrode according to a procedure of the present invention.

The porous substrate 21 was punched to a disc having 0.5 inch of diameter, then the disc was subjected to ultrasonic cleaning in a trichlene solution followed by drying. The obtained substrate is shown in FIG. 3 diagramatically.

Figure 4:
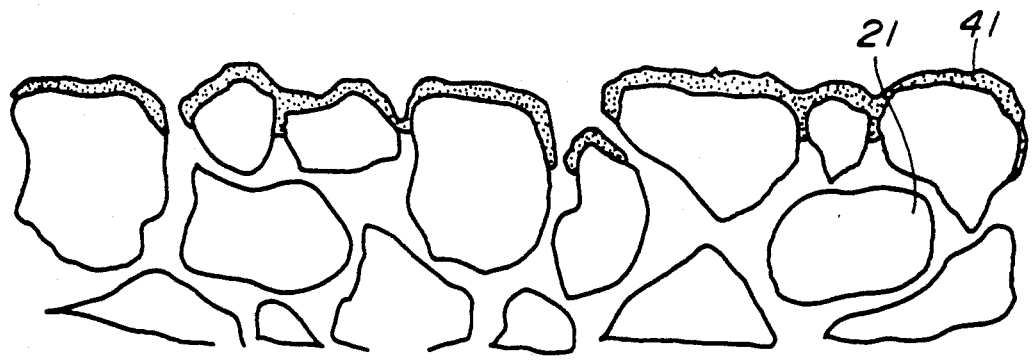

Then nickel powder having a particle diameter of less than or equal to 1 µm (hereinafter, submicron diameter) and nickel powder having particle diameter of 3 µm were mixed at a volume ratio of 1:1, and dissolved in water. The solution of the nickel powder mixture was applied uniformly on the porous substrate 21 as shown in FIG. 4. The applied solution was dried at ambient temperature, then sintered at 1000° C. for 1 hour in a hydrogen atmosphere. Thus, a first nickel film 41 was formed.

Figure 5:
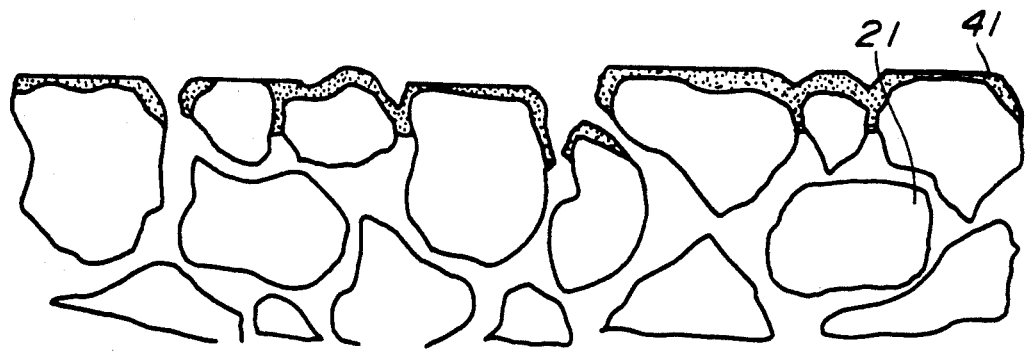
Figure 6:
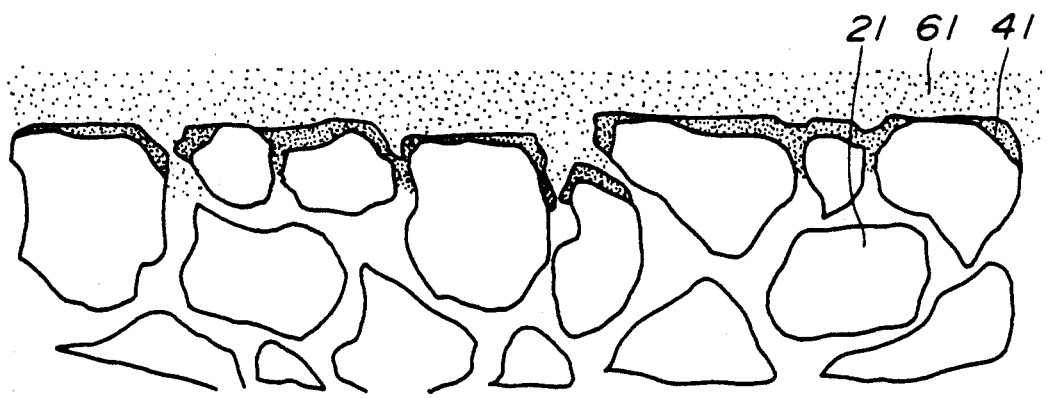

The surface of the first nickel film 41 was polished as shown in FIG. 5, to remove projections therefrom. As an agent for the polishing, a #600 grit paper was used. The polished nickel film 41 was subjected to ultrasonic cleaning in deionized water and trichlorethylene solution for 10 min, the cleaned film was thereafter dried at ambient temperature. Then about 50 mg of nickel powder having a particle diameter of 3 µm was applied uniformly to the surface of the first nickel film 41 of the porous substrate 21, a pressure of about 700 kg/cm$^2$G was applied to the film, and the newly obtained film was sintered at 750° C. for 1 hour in a hydrogen atmosphere. Thus, a second nickel film 61 was formed as shown in FIG. 6.

Figure 7:
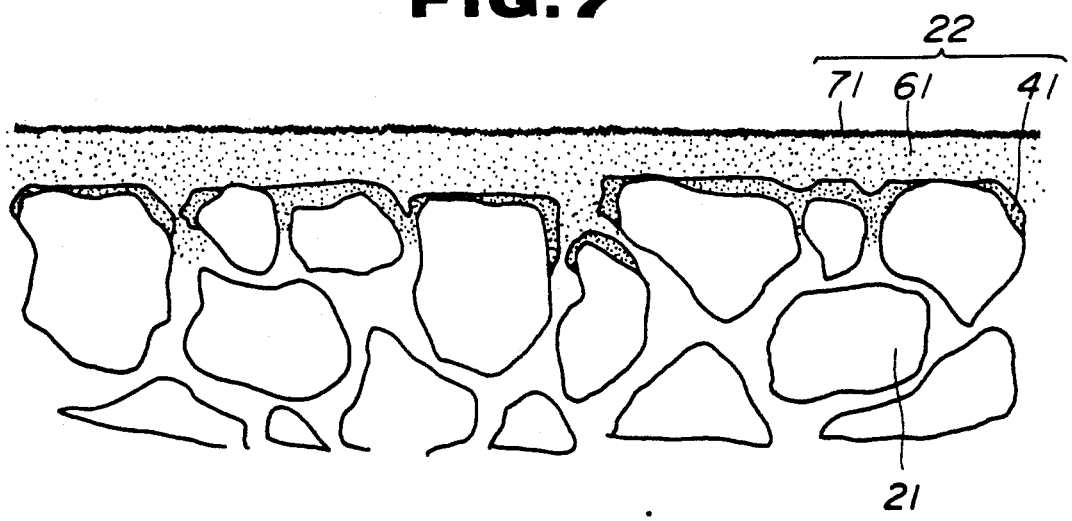

Nickel powder having submicron diameter was rubbed into the surface of the second nickel film 61, and pressure of about 700 kg/cm$^2$G was applied to the film, nickel powder having submicron diameter was again rubbed into the surface of the pressed film, and the obtained film was again sintered at 750° C. for 1 hour in a hydrogen atmosphere. Thus, a third nickel film 71 was formed as shown in FIG. 7.

According to the above procedure, a hydrogen electrode film 22 having thickness of about 100 µm which was composed of the first nickel film 41, the second nickel film 61 and the third nickel film 71 laminated sequentially on the surface of the porous substrate 21, was obtained. Voids having diameter of 1 to 3 µm opened uniformly at the top surface thereof.

After forming the third nickel film 71, platinum (Pt) was laminated on the surface of the third film 71 to be about 200 µm thickness using sputtering technique. Sputtering was performed using a high frequency sputtering system targeting Pt under $5 \times 10^{-2}$ mmHg of pressure for 1 hour in an argon (Ar) gas atmosphere.

Coating of the surface of the third nickel film 71 by Pt is effective for promoting a reaction at the electrode indicated as follows, because Pt acts as catalyst;

$$O^{2-} + H_2 = H_2O + 2e^-$$

Therefore, high electric power can be produced easily and quickly in the cell when coating of Pt is applied.

Further to say, as the preferred porous substrate, it may also be formed of nickel or copper. The porous substrate formed of nickel is formed by sintering the nickel powder, the void size of the obtained substrate becomes dispersed in a range of 3 to 50 µm as irregular surface which is formed according to configuration of nickel powder. As nickel powder has high adherence to the nickel powder electrode film, it has higher water resistance than a substrate formed of stainless steel. Alternatively, the porous substrate can also be formed of copper powder. As the configuration of copper powder is round, configuration of the voids can be rounded and the void size thereof becomes 3 to 40 µm which is similar to nickel powder. The porous substrate using the copper powder becomes an insulator when contacted with oxygen, therefore it cannot be used as the oxygen electrode but is most preferrably used as a hydrogen electrode.

The solidous electrolyte 23 in FIG. 2 is formed as in the following examples;

EXAMPLE 2

A 10 µm thickness solidous electrolyte film was formed on the Pt coated hydrogen electrode film 22 which was laminated on the porous substrate 21. An electron beam sputtering technique was applied to the forming, using a turbo-pump in a vacuum at $10^{-8}$ mmHg. The temperature of the substrate was varied in a range of ambient to 580° C., sputtering speed was controlled by a controller. As the material of the solidous electrolyte, single LaF$_3$ crystals were used, the solidous electrolyte film was formed under conditions of 500° C. of substrate temperature, 20 Å/sec of sputtering speed and −3.0 kV of accelerating voltage. Thus, a solidous electrolyte film having no pin holes was obtained.

EXAMPLE 3

Resistance heating was applied to the forming, using a turbo-pump as mentioned in the first procedure in a vacuum at $10^{-8}$ mmHg. The temperature of the substrate was determined at 400° C., with a sputtering speed of 3 to 5 Å/sec. The forming was performed over about 5 to 6 hours. A 10 μm thickness solidous electrolyte film having no pin holes was obtained. $La_{1-x}SrF_{3-x}$ can also be used as material for the solidous electrolyte. When X-ray diffraction was applied to the film obtained from $La_{0.95}Sr_{0.95}F_{2.95}$, only a peak of $LaF_3$ was found. From this result, the obtained film of solidous electrolyte was not formed of a mixture of $LaF_3$ and $SrF_2$ but only of $LaF_3$.

EXAMPLE 4

A magnetron sputtering technique was applied to the forming, at a 400° C. substrate temperature under a pressure of $5.3 \times 10^{-3}$ mmHg in an Ar atmosphere. Sputtering was performed over 40 hours using a target of $LaF_3$ powder. A 10 μm film thickness was obtained. It was concluded from the results of X-ray diffraction tests, that the obtained film was formed an $LaF_3$ polycrystal having poor crystaline quality.

As the solidous electrolyte material it is preferrable to use following compounds $La_{0.95}Sr_{0.05}F_{2.95}$, $La_{0.95}Sr_{0.10}F_{2.90}$, $La_{0.95}Ba_{0.05}F_{2.29}$, or $La_{0.90}Ba_{0.10}F_{2.29}$.

The composition of solidous electrolyte films obtained by sputtering techniques are similar to the composition of the original materials before sputtering even if materials having complex composition are used. Therefore, the sputtering method is preferred to thinner lamination qualities of materials having complex compositions such as $La_{0.95}Sr_{0.05}F_{2.95}$.

EXAMPLE 5

A metal organic chemical vapor deposition (MOCVD) technique was applied to forming the film of solidous electrolyte. Metal organic compounds including La and F in its molecule were heat-decomposed, then the obtained film of $LaF_3$ was laminated on the Pt coated surface of the third nickel film 71 formed on the porous substrate 21 as shown in FIG. 6. The structural formula of the compound is following;

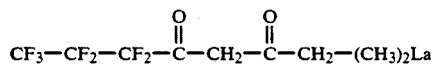

The film forming was accomplished under the following conditions, i.e., the temperature of the substrate was determined at 600° C., the temperature of the metal organic compounds was maintained at 230° C., with argon gas (Ar) as a carrier gas at flow rate of 100 ml/min. Steam of the metal organic compounds in a reactor was moved to the surface of the porous substrate 21 to react with it, thus a film of $LaF_3$ was obtained.

EXAMPLE 6

A high frequency sputtering technique was applied to forming the film of solidous electrolyte, using a high frequency sputtering system at the temperature of the substrate of 800° C., under the pressure of Ar at $5.3 \times 10^{-3}$ mmHg. For a target, zirconia stabilized by addition of yttria was used. The sputtering was performed over 40 hours, and a 10 μm thickness of film of solidous electrolyte having no pin holes was obtained thereafter. Compounds such as cerium oxide may also be used.

The oxygen electrode film 24 is formed as in the following examples.

EXAMPLE 7

The oxygen electrode film was formed of perovskite compound. A perovskite compound of $La_{0.6}Sr_{0.4}CoO_x$ was obtained by mixing powder of cobalt acetate $(CH_3COO)_2CO$ $4H_2O$, lanthanum acetate $(CH_3COO)_2La$ and strontium acetate $(CH_3COO)_2Sr$, which amounts thereof were weighed corresponding to a composition ratio of $La_{0.6}Sr_{0.4}CoO_x$. The mixture of powder as above described was baked at 1000° C. for 5 hours in an oxygen atmosphere. The electric resistance ratio of the obtained perovskite compound was 4.4 ohm.cm.

The perovskite compound was dissolved in propylene glycol, then this solution was applied to the surface of the solidous electrolyte film 23, baked under pressure at 300° C. for 8 hours in an oxygen atmosphere over 8 hours. Thus, an oxygen electrode film 24 as shown in FIG. 2 was obtained.

EXAMPLE 8

A perovskite compound was formed as shown in Example 7.

The obtained compound was mixed with platinum black at a ratio of 3:1, then dissolved in propylene glycol. The mixture was applied to the surface of the solidous electrolyte film 23, then baked under the same conditions described in Example 7, thus an oxygen electrode film 24 was obtained.

EXAMPLE 9

A perovskite compound was formed as shown in Example 7.

The obtained compound was then sputtered on the surface of the solidous electrolyte film 23 using a high frequency sputtering system. The sputtering was accomplished in an Ar atmosphere under a pressure of $1 \times 10^{-2}$ mmHg, at 0.5 μm/hour sputtering speed for 2 hours, thus about a 1 μm thickness of oxygen electrode film 24 was obtained.

The perovskite compound as above mentioned has similar characteristics to platinum but is greatly less expensive.

EXAMPLE 10

Ag powder was dissolved in propylene glycol then the obtained solution was applied to the surface of the solidous electrolyte film 23. The film was baked under pressure at 300° C. in an oxygen atmosphere for 8 hours. Thus, an oxygen electrode film 24 was obtained.

EXAMPLE 11

Chloroplatinic acid $(H_2PtCl_6)$ was dissolved in propylene glycol. The obtained solution was treated as described in Example 10, thus, an oxygen electrode film 24 was obtained.

Referring now again to FIG. 2, the porous substrate, the hydrogen electrode film, the solidous electrolyte film, and the oxygen electrode film formed as previously described are stacked sequentially to form a cell unit structure. The cell unit is installed in a cell casing 25 having conductivity to electrically connect the hydrogen electrode film 22 of the cell unit with the casing 25. Concurrently, the oxygen electrode film 24 is connected electrically with a separator 27 which is adhered to the cathode side. A insulator 26 is installed between the cell casing 25 and the separator 27. Thus, a fuel cell body 40a is constructed. At the side of the porous substrate 21 of the cell body 40a, a conductive separator 27' is connected electrically with the cell casing 25 concurrently with the oxygen electrode film 24' at both sides of the separator 27'. A insulator 26' is installed between the separator 27' and the casing 25', thus a fuel cell body 40b is constructed and stacked with the cell body 40a. Similarly, fuel cell bodies 40c, 40d... (not shown in FIG. 2) are constructed and stacked sequentially. Therefore, a plurality of the cell units can be stacked connected in series. Oxygen, as an oxidant, is provided from gas inducing paths 29 and 29' to the cells, and hydrogen as fuel is provided from gas inducing paths 30 and 30' to the cells, thus, electric powder is produced.

According to the present invention, as the hydrogen electrode is formed of fine powder mixture of nickel then sintered, void sizes can be homogenized. Thus, formation of pin holes on the films laminated on the electrode can be avoided even if a very thin solidous electrolyte film is laminated. Accordingly, voltage dropping can be reduced by reducing the thickness of the solidous electrolyte.

While the present invention has been disclosed in terms of the preferred embodiment in order to facilitate better understanding thereof, it should be appreciated that the invention can be embodied in various ways without departing from the principles thereof. Therefore, the invention should be understood to include all possible embodiments and modifications to shown embodiments which can be embodied without departing from the principle of the invention as set out in the appended claims.

What is claimed is:

1. A fuel cell constructed of a plurality of cell unit structures stacked and connected in series, wherein said cell unit structure comprising;
   a porous substrate,
   a hydrogen electrode film stacked on the porous substrate, said hydrogen electrode formed of fine particles of nickel powder having fine voids of homogeneous diameter,
   a solid electrolyte film stacked on the hydrogen electrode film, and
   an oxygen electrode film stacked on the solid electrolyte film.

2. A fuel cell constructed of a plurality of cell unit structures stacked and connected in series, wherein said cell unit structure comprising;
   a porous substrate,
   a hydrogen electrode film stacked on the porous substrate, said hydrogen electrode formed of fine particles of nickel powder having fine voids of homogeneous diameter,
   a coating of platinum stacked on the hydrogen electrode film,
   a solid electrolyte film stacked on the platinum coating, and
   an oxygen electrode film stacked on the solid electrolyte film.

3. A fuel cell constructed of a plurality of cell unit structures stacked and connected in series, wherein said cell unit structure comprises;
   a porous substrate,
   a hydrogen electrode film stacked on said porous substrate, said film formed of a mixture of a first nickel powder having diameter of less than or equal to 1 $\mu$m and a second nickel powder having diameter of less than or equal to 3 $\mu$m, for forming fine voids of homogeneous diameter,
   a coating of platinum stacked on said hydrogen electrode film,
   a solid electrolyte film stacked on said platinum coating, and
   an oxygen electrode film stacked on said solid electrolyte film.

4. A fuel cell as set forth in claim 1, wherein said porous substrate is formed of stainless steel.

5. A fuel cell as set forth in claim 1, wherein said porous substrate is formed of nickel powder.

6. A fuel cell as set forth in claim 1, wherein said porous substrate is formed of copper powder.

7. A fuel cell as set forth in claim 1, wherein said homogeneous diameter of said voids is in a range of 1 to 3 $\mu$m.

8. A fuel cell as set forth in claim 1, wherein said solid electrolyte is formed of single $LaF_3$ crystals.

9. A fuel cell as set forth in claim 1, wherein thickness of said solid electrolyte film is 10 $\mu$m.

10. A fuel cell as set forth in claim 1, wherein said oxygen electrode film is formed of a perovskite compound.

11. A fuel cell as set forth in claim 10, wherein said perovskite compound is $La_{0.6}Sr_{0.4}CoO_x$.

12. A fuel cell as set forth in claim 1, wherein said oxygen electrode film is formed of a solution of silver.

13. A fuel cell as set forth in claim 1, wherein said oxygen electrode film is formed of a solution of chloroplatinic acid.

* * * * *